(12) United States Patent
Kato et al.

(10) Patent No.: US 9,540,468 B2
(45) Date of Patent: Jan. 10, 2017

(54) RESIST COPOLYMER AND RESIST COMPOSITION

(71) Applicant: Mitsubishi Rayon Co., Ltd., Chiyoda-ku (JP)

(72) Inventors: Keisuke Kato, Yokohama (JP); Atsushi Yasuda, Yokohama (JP); Ryuichi Ansai, Yokohama (JP); Shinichi Maeda, Tokyo (JP)

(73) Assignee: Mitsubishi Rayon Co., Ltd., Chiyoda-ku (JP)

( * ) Notice: Subject to any disclaimer, the term of this patent is extended or adjusted under 35 U.S.C. 154(b) by 0 days.

(21) Appl. No.: 14/300,558

(22) Filed: Jun. 10, 2014

(65) Prior Publication Data

US 2014/0371412 A1    Dec. 18, 2014

(30) Foreign Application Priority Data

Jun. 14, 2013 (JP) ................. 2013-126018
Jan. 6, 2014 (JP) ................. 2014-000356

(51) Int. Cl.
| | | |
|---|---|---|
| *C08F 220/18* | (2006.01) | |
| *C08F 220/28* | (2006.01) | |
| *G03F 7/039* | (2006.01) | |
| *C08F 220/42* | (2006.01) | |
| *G03F 7/023* | (2006.01) | |

(52) U.S. Cl.
CPC .......... *C08F 220/18* (2013.01); *C08F 220/28* (2013.01); *C08F 220/42* (2013.01); *G03F 7/0233* (2013.01); *G03F 7/0397* (2013.01); *C08F 2220/283* (2013.01)

(58) Field of Classification Search
None
See application file for complete search history.

(56) References Cited

U.S. PATENT DOCUMENTS

| | | | | |
|---|---|---|---|---|
| 2006/0127801 | A1 | 6/2006 | Momose et al. | |
| 2008/0274421 | A1* | 11/2008 | Tsubaki | G03F 7/0045 430/270.1 |
| 2011/0143280 | A1* | 6/2011 | Yamamoto | C09D 133/16 430/270.1 |
| 2011/0244392 | A1* | 10/2011 | Hirano et al. | 430/270.1 |
| 2011/0318687 | A1* | 12/2011 | Saegusa | G03F 7/0045 430/270.1 |
| 2012/0015301 | A1* | 1/2012 | Yoshidome et al. | 430/285.1 |
| 2012/0219913 | A1* | 8/2012 | Kataoka | G03F 7/0397 430/285.1 |
| 2012/0321855 | A1* | 12/2012 | Iwato et al. | 428/156 |
| 2013/0078434 | A1* | 3/2013 | Koshijima | G03F 7/0045 428/195.1 |

FOREIGN PATENT DOCUMENTS

| | | | |
|---|---|---|---|
| JP | 10-274852 | A | 10/1998 |
| JP | 10-319595 | A | 12/1998 |
| JP | 2005-023092 | * | 1/2005 |
| JP | 2006-016520 | * | 1/2006 |
| JP | 2007-178621 | A | 7/2007 |
| JP | 2011-215333 | * | 10/2011 |
| WO | WO 2004/067592 | A1 | 8/2004 |

OTHER PUBLICATIONS

Shin Kamijo, et al., "Photochemically induced radical transformation of $C(sp^3)$-H bonds to $C(sp^3)$-CN bonds", Organic Letters, vol. 13, No. 21, 2011, pp. 5928-5931.

* cited by examiner

*Primary Examiner* — Martin Angebranndt
(74) *Attorney, Agent, or Firm* — Oblon, McClelland, Maier & Neustadt, L.L.P.

(57) ABSTRACT

Provided is a resist copolymer which has favorable sensitivity, enables a resist pattern to be formed to have a favorable shape, has favorable dry etching resistance when a dry etching is carried out using the resist pattern as a mask, and suppresses the surface roughness of a pattern formed by carrying out a dry etching process to a substrate.

A resist copolymer including a constituent unit (1) based on a (meth)acrylic acid ester derivative having a cyclic hydrocarbon group such as an adamantane ring and two or more cyano groups bonded to the cyclic hydrocarbon group, a constituent unit (2) having a lactone backbone and a cross-linking cyclic structure, and a constituent unit (3) having an acid leaving group.

1 Claim, No Drawings

RESIST COPOLYMER AND RESIST COMPOSITION

TECHNICAL FIELD

The present invention relates to a resist copolymer and a resist composition using the same.

Priority is claimed on Japanese Patent Application No. 2013-126018, filed Jun. 14, 2013, and Japanese Patent Application No. 2014-000356, filed Jan. 6, 2014, the contents of which are incorporated herein by reference.

BACKGROUND ART

In recent years, along with progress of the lithography technique, a resist pattern formed during a manufacturing process of a semiconductor device or a liquid crystal device has been micronized. As a method for micronization, irradiation light has been shortened in wavelength. To be specific, ultraviolet ray typified by g-ray (wavelength 438 nm) or i-ray (wavelength: 365 nm) of the related art has been replaced by DUV (Deep Ultra Violet) having a shorter wavelength.

Recently, a KrF excimer laser (wavelength: 248 nm) lithography technique has been introduced as a DUV lithography technique, and an ArF excimer laser (wavelength: 193 nm) lithography technique and an EUV (wavelength: 13.5 nm) lithography technique, which are intended to realize shorter wavelength, have been studied. Further, a liquid immersion lithography technique has also been studied. Furthermore, as a lithography technique, which is different from the above techniques, an electron beam lithography technique has been studied.

As a high sensitivity resist composition used for forming a resist pattern by a DUV lithography technique or an electron beam lithography technique, a "chemically amplified resist composition" containing a photoacid generator has been improved and developed.

For example, as a chemically amplified resist material used for an ArF excimer laser lithography technique, an acrylic polymer, which is transparent to light having a wavelength of 193 nm has received great attention. As an acrylic polymer, for example, a copolymer of a (meth)acrylic acid ester having an adamantane backbone in an ester moiety and a (meth)acrylic acid ester having a lactone backbone in an ester moiety has been suggested (Patent Documents 1 and 2, and the like)

However, when the acrylic copolymer is used as a resist copolymer, a shape of a resist pattern to be formed is not necessarily favorable, and dry etching resistance after the resist pattern is formed is not sufficient to suppress the surface roughness of a pattern formed when a dry etching is carried out using the resist pattern as a mask and a substrate is processed, and, thus, improvement in these properties has been demanded.

Further, Patent Document 3 discloses a copolymer that contains a cyano group in two or more kinds of constituent units containing a lactone backbone, and Patent Document 4 discloses a copolymer containing a constituent unit that contains a cyano group in a norbornane backbone, and Patent Documents 3 and 4 also describe that performance of lithography is improved by applying these copolymers.

CITATION LIST

Patent Document

Patent Document 1: JP 10-319595 A
Patent Document 2: JP 10-274852 A
Patent Document 3: JP 2007-178621 A
Patent Document 4: WO 2004/067592 A

DISCLOSURE OF THE INVENTION

Problem to be Solved by the Invention

However, in the method described in Patent Document 3 or Patent Document 4, performance of lithography is not necessarily sufficient. That is, in the copolymer described in Patent Document 3 or Patent Document 4, sensitivity or resolution, and formation of a resist pattern are improved, but the dry etching resistance and the surface roughness of a pattern alter etching are not necessarily sufficient. In particular, according to recent demands for micronization, a value of surface roughness is demanded to be suppressed to 1 to 2 nm or less, and, thus, improvement in surface roughness is demanded. Further, improvement in dry etching resistance is important for realizing a thinned resist film.

An object of the invention is to provide a resist copolymer which has favorable sensitivity, enables a resist pattern to be formed to have a favorable shape, has favorable dry etching resistance when a dry etching is carried out using the resist pattern as a mask, and suppresses the surface roughness of a pattern formed by carrying out a dry etching process to a substrate, and a resist composition using the same.

Means for Solving Problem

The invention includes the following [1] to [5].

[1] A resist copolymer including a constituent unit represented by the following Formula (1), a constituent unit represented by the following Formula (2), and a constituent unit having an acid leaving group.

[chemical formula 1]

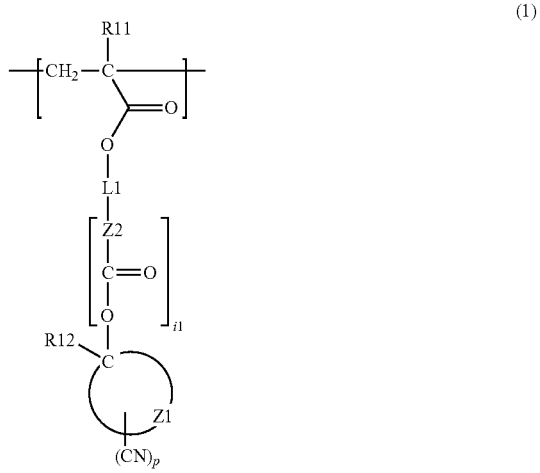

(In Formula (1), R11 represents a hydrogen atom or a methyl group; L1 represents a divalent linear or branched hydrocarbon group which has 1 to 20 carbon atoms and may have a substituent, a divalent cyclic hydrocarbon group which has 1 to 20 carbon atoms and may have a substituent and/or a hetero atom, or a single bond; Z1 represents a monocyclic or polycyclic atomic group; R12 represents a hydrogen atom or an alkyl group having 1 to 4 carbon atoms; R12 and Z1 may be bonded to form a cyclic structure; p represents an integer of 2 to 4, 2 to 4 cyano groups are bonded to carbon atoms of the atomic group represented by Z1, and 2 cyano groups may be bonded to the same carbon atom; and Z2 represents a divalent linear or branched hydrocarbon group having 1 to 12 carbon atoms, and i1 represents an integer of 0 to 3.)

[chemical formula 2]

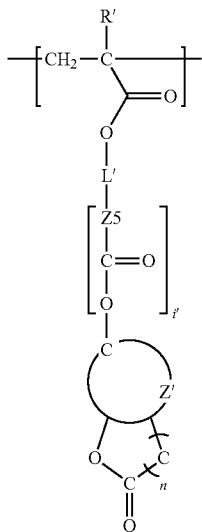

(2)

(In Formula (2), R' represents a hydrogen atom or a methyl group; L' represents a divalent linear or branched hydrocarbon group which has 1 to 20 carbon atoms and may have a substituent, a divalent cyclic hydrocarbon group which has 1 to 20 carbon atoms and may have a substituent and/or a hetero atom, or a single bond; Z' represents a monocyclic or polycyclic atomic group, and Z' and a lactone ring are condensed; n represents an integer of 0 to 4; Z5 represents a divalent linear or branched hydrocarbon group having 1 to 12 carbon atoms; and i' represents an integer of 0 to 3.)

[2] The resist copolymer according to [1], in which the constituent unit represented by Formula (2) above is one or more kinds selected from the group consisting of a constituent unit represented by the Following Formula (2-1) and a constituent unit represented by the following Formula (2-2).

[chemical formula 3]

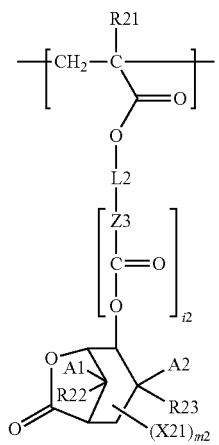

(2-1)

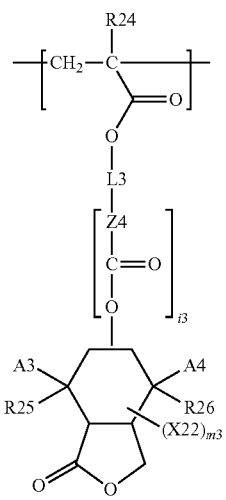

(2-2)

(In Formula (2-1), R21 represents a hydrogen atom or a methyl group; L2 represents a divalent linear or branched hydrocarbon group which has 1 to 20 carbon atoms and may have a substituent, a divalent cyclic hydrocarbon group which has 1 to 20 carbon atoms and may have a substituent and/or a hetero atom, or a single bond; R22 and R23 each independently represent a hydrogen atom, a linear or branched alkyl group having 1 to 6 carbon atoms, a hydroxyl group, a carboxyl group, or a carboxyl group esterified with an alcohol having 1 to 6 carbon atoms; A1 and A1 together represent —O—, —S—, —NH— or a methylene chain [—(CH$_2$)$_k$— (k represents an integer of 1 to 6)] having 1 to 6 carbon atoms; X21 represents a linear or branched alkyl group has 1 to 6 carbon atoms and which may have at least one group, as a substituent, selected from the group consisting of a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, and an amino group, a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, or an amino group; m2 represents an integer of 0 to 4, and when m2 is 2 or greater, plurality of X21 may be the same or different from each other; and Z3 represents a divalent linear or branched hydrocarbon group having 1 to 12 carbon atoms, and i2 represents an integer of 0 to 3.)

(In Formula (2-2), R24 represents a hydrogen atom or a methyl group: L3 represent a divalent linear or branched hydrocarbon group which has 1 to 20 carbon atoms and may have a substituent, a divalent cyclic hydrocarbon group which has 1 to 20 carbon atoms and may have a substituent and/or a hetero atom, or a single bond; R25 and R26 each independently represent a hydrogen atom, a linear or branched alkyl group having 1 to 6 carbon atoms, a hydroxyl group, a carboxyl group, or a carboxyl group esterified with an alcohol having 1 to 6 carbon atoms; A3 and A4 each independently represent a hydrogen atom, a linear or branched alkyl group having 1 to 6 carbon atoms, a hydroxyl group, a carboxyl group, or a carboxyl group esterified with an alcohol having 1 to 6 carbon atoms, or A3 and A4 together represent —O—, —S—, —NH— or a methylene chain [—(CH$_2$)$_l$— (l represents an integer of 1 to 6)] having 1 to 6 carbon atoms; X22 represents a linear or branched alkyl group which has 1 to 6 carbon atoms and may have at least one group, as a substituent, selected from the group consisting of a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, and an amino group, a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, or an amino group; m3 represents an integer of 0 to 4, and when m3 is 2 or greater, plurality of X22 may be the same or different from each other; and Z4 represents a divalent linear or branched hydrocarbon group having 1 to 12 carbon atoms, and i3 represents an integer of 0 to 3.)

[3] The resist copolymer according to [1] or [2], in which the constituent unit represented by above Formula (1) is one or more kinds selected from the group consisting of a constituent unit represented by the following Formula (3-1) and a constituent unit represented by the following Formula (3-2).

In Formulas (3-1) and (3-2), R31 and R32 each independently represent a hydrogen atom or a methyl group; and p represents an integer of 2 to 4.

[chemical formula 4]

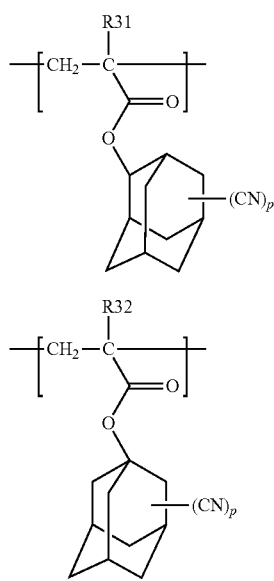

[4] The resist copolymer according to [3], in which the constituent unit represented by above Formula (1) is a constituent unit represented by the following Formula (4-1).

In Formula (4-1), R41 represents a hydrogen atom or a methyl group.

[chemical formula 5]

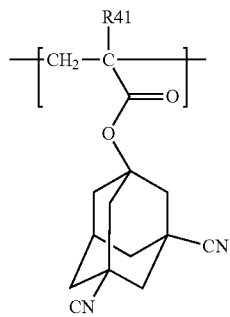

[5] A resist composition including the resist copolymer according to any one of [1] to [4].

Effect of the Invention

According to the invention, it is possible to obtain a resist copolymer which has favorable sensitivity, enables a resist pattern to be formed to have a favorable shape, has favorable dry etching resistance when a dry etching is carried out using the resist pattern as a mask, and suppresses the surface roughness of a pattern formed by carrying out a dry etching process to a substrate, and a resist composition using the same.

MODE(S) FOR CARRYING OUT THE INVENTION

In the present specification, the term "constituent unit (repeating unit)" means a unit derived from a single monomer in a copolymer.

A resist copolymer refers to a copolymer used for forming a resist film when a pattern is formed by exposure and development in a lithography process.

The resist copolymer (hereinafter, sometimes simply referred to as "copolymer") of the present invention has one or more kinds of constituent units (hereinafter, sometimes referred to as "constituent unit (1)") represented by above Formula (1), one or more kinds of constituent units (hereinafter, sometimes referred to as "constituent unit (2)") selected from the group consisting of a constituent unit represented by above Formula (2-1) and a constituent unit represented by above Formula (2-2), and one or more kinds of constituent units (hereinafter, sometimes referred to as "constituent unit (3)") having an acid leaving group.

The constituent unit (1) is a constituent unit having multiple cyano groups which are polar groups and also hydrophilic groups.

The constituent unit (2) is a constituent unit having a group containing a lactone backbone of a polar group.

The copolymer having these constituent units (1) to (3) is suitable for a resist copolymer, and particularly suitable as a chemically amplified resist copolymer that is applied to a method of forming a pattern exposed to light having a wavelength of 250 nm or less.

In the present specification, the term "(meth)acrylic acid" means acrylic acid or methacrylic acid, and the term "(meth) acryloyloxy" means acryloyloxy or methacryloyloxy.

<Constituent Unit (1)>

The constituent unit (1) represented by the following Formula (1) is formed by cleavage of an ethylenic double bond of a (meth)acrylic acid ester derivative (hereinafter, sometimes referred to as "monomer (1)") corresponding to this constituent unit.

[chemical formula 6]

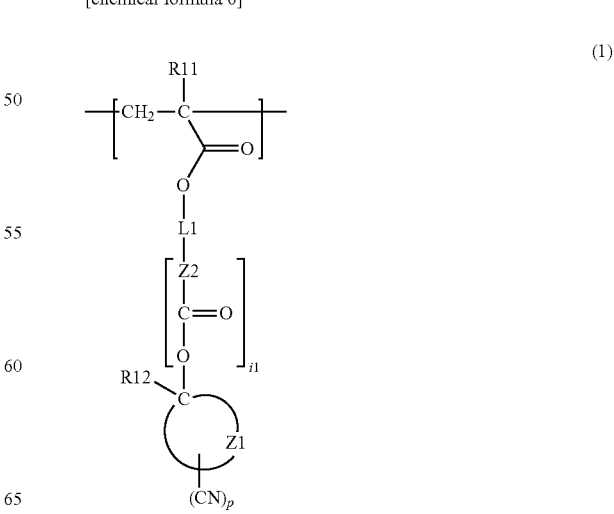

In Formula (1), R11 represents a hydrogen atom or a methyl group. A methyl group is preferable to easily obtain more favorable thermal resistance.

In Formula (1), Z1 represents a monocyclic or polycyclic atomic group. That is, Z1 represents an atomic group constituting a cyclic hydrocarbon group, preferably a cross-linking cyclic hydrocarbon group together with an ester-bonded carbon atom and a cyano group-bonded carbon atom. The number of carbon atoms of the cyclic hydrocarbon group is not specifically limited, but preferably 7 to 20. The cyclic hydrocarbon group may have a substituent besides the cyano group. Examples of the substituent may include a linear or branched alkyl group which has 1 to 6 carbon atoms and may have at least one group selected from the group consisting a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, and an amino group, a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, or an amino group.

In Formula (1), the ester-bonded carbon atom means a carbon atom bonded to an oxygen atom (—O—) of —Z2-C(O)—O— in Formula (1). When i1 is 0, this carbon atom is bonded to L1 in Formula (1). When i1 is 0 and L1 is a single bond, this carbon atom is bonded to a (meth)acryloyloxy group.

As Z1, an atomic group constituting a cross-linking cyclic hydrocarbon group together with an ester-bonded carbon atom and a cyano group-bonded carbo atom is preferable since dry etching resistance required for resist is high.

Examples of Z1 may include atomic groups having cyclic terphene hydrocarbon such as a norbornane ring, an adamantane ring, a tetracyclododecane ring, a dicyclopentane ring, a tricyclodecane ring, a decahydronaphthalene ring, a polyhydro anthracene ring, a camphor ring, and a cholesteric ring.

Of these, an atomic group having cyclic terphene hydrocarbon such as a norbornane ring, an adamantane ring, a tetracyclododccane ring, a dicyclopentane ring, or a tricyclodecane ring is preferable since dry etching resistance required for resist is high, and an atomic group having an adamantane ring is more preferable sine a carbon density is high and higher dry etching resistance can be obtained.

In Formula (1), R12 represents a hydrogen atom or an alkyl group having 1 to 4 carbon atoms, and R12 and Z1 may be bonded to form a cyclic structure. That R12 and Z1 may be bonded to form a cyclic structure means that an alkyl group as R12 is bonded to Z1, thereby forming an alkylene group, and this alkylene group constitutes a part of a cyclic hydrocarbon group as Z1.

p represents the number of cyano groups contained in a cyclic hydrocarbon group as Z1, and is an integer of 2 to 4. That is, 2 to 4 cyano groups are bonded to carbon atoms of the atomic group represented by Z1. Since the constituent unit (1) has 2 or more cyano groups, dry etching resistance is improved and the surface roughness of a pattern after etching is suppressed. p is preferably 2 or 3, and more preferably 2.

In a cyclic hydrocarbon group as Z1, 2 cyano groups may be bonded to the same carbon atom. In view of adhesion to a metal surface or the like, preferably, 2 to 4 cyano groups are respectively bonded to different carbon atoms.

In Formula (1), L1 represents a divalent linear or branched hydrocarbon group which has 1 to 20 carbon atoms and may have a substituent, a divalent cyclic hydrocarbon group which has 1 to 20 carbon atoms and may have a substituent and/or a hetero atom, or a single bond. As examples of the substituent in L1, there may be substituents represented by the following Formulas (5-1) to (5-33). As examples of the hetero atom, there may be a nitrogen atom, an oxygen atom, a sulfur atom, a phosphorus atom, and the like. L1 is preferably a single bond to easily obtain favorable solubility in an organic solvent.

Z2 represents a divalent linear or branched hydrocarbon group having 1 to 12 carbon atoms.

i1 is an integer of 0 to 3, and preferably 0 in view of resolution.

[chemical formula 7]

(5-1)

(5-2)

(5-3)

(5-4)

(5-5)

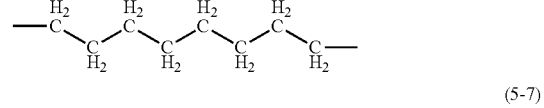
(5-6)

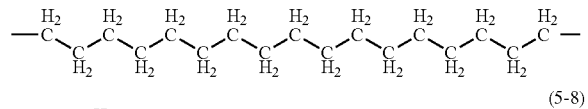
(5-7)

(5-8)

(5-9)

(5-10)

(5-11)

(5-12)

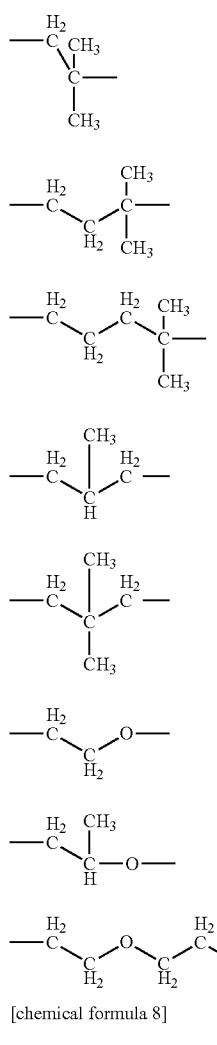

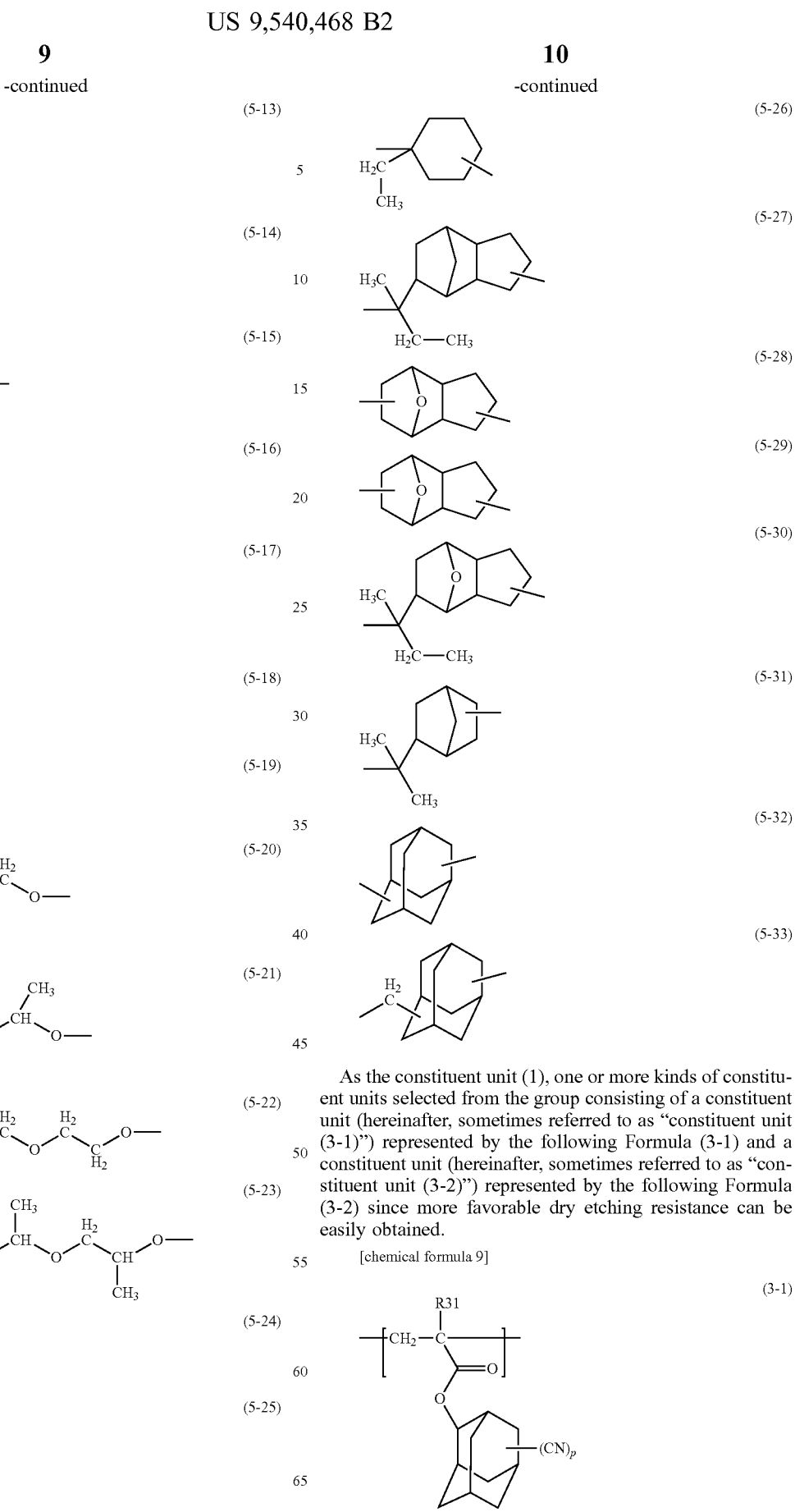

As the constituent unit (1), one or more kinds of constituent units selected from the group consisting of a constituent unit (hereinafter, sometimes referred to as "constituent unit (3-1)") represented by the following Formula (3-1) and a constituent unit (hereinafter, sometimes referred to as "constituent unit (3-2)") represented by the following Formula (3-2) since more favorable dry etching resistance can be easily obtained.

[chemical formula 9]

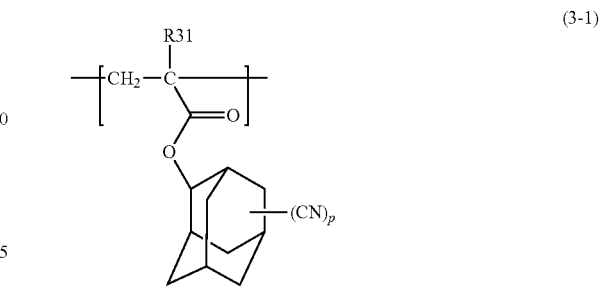

(3-2)

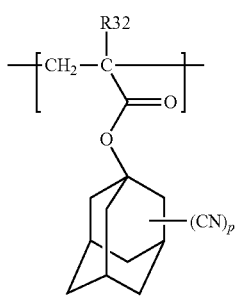

In Formula (3-1), R31 is the same as the group of R11 in Formula (1) including a preferable aspect. In Formula (3-2), R32 is the same as the group of R11 in Formula (1) including a preferable aspect. In Formula (3-1) or Formula (3-2), p is the same as p in Formula (1) including a preferable aspect. The constituent unit (3-2) is preferable since workability in synthesis is more favorable, and particularly, a constituent unit (hereinafter, sometimes referred to as "constituent unit (4-1)") represented by the following Formula (4-1) is preferable.

In Formula (4-1), R41 is identical with R11 in Formula (1) including a preferable aspect.

[chemical formula 10]

(4-1)

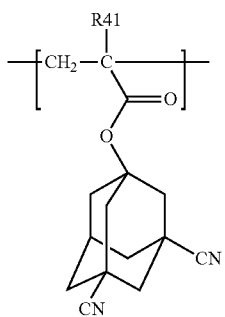

<Monomer (1)>

The (meth)acrylic acid ester derivative (monomer (1)) corresponding to the constituent unit (1) is available from commercial products. Otherwise, it may be produced using a publicly-known method of introducing a cyano group.

For example, a monomer represented by the following Formula (m5) can be produced by a method described in ORGANIC LETTERS Vol. 13, No. 21(2011), 5928 with 1-adamantanol as a starting material and a cyanizing agent such as p-toluenesulfonyl cyanide or the like.

With an amount of the cyanizing agent used with respect to 1-adamantanol, the number of cyano groups to be added to 1-adamantanol can be controlled. According to this method, a product may be a mixture of compounds including 0 to 3 cyano groups. In this case, a target compound can be separated by known methods such as column purification, distillation, and the like.

<Constituent Unit (2)>

The constituent unit (2) represented by the following Formula (2) is formed by cleavage of an ethylenic double bond of a (meth)acrylic acid ester derivative (hereinafter, sometimes referred to as "monomer (2)") corresponding to this constituent unit. The constituent unit (2) represented by Formula (2) has a lactone backbone and a cross-linking cyclic structure.

[chemical formula 11]

(2)

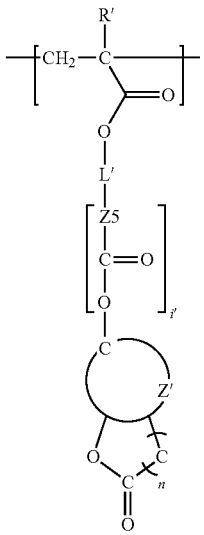

In Formula (2), R' represents a hydrogen atom or a methyl group. A methyl group is preferable in view of thermal resistance.

L' represents a divalent linear or branched hydrocarbon group which has 1 to 20 carbon atoms and may have a substituent, a divalent cyclic hydrocarbon group which has 1 to 20 carbon atoms and may have a substituent and/or a hetero atom, or a single bond.

Examples of the substituent or the hetero atom in L' may include the same substituents or hetero atoms as the examples in L1 of Formula (1). L' is preferably a single bond to easily obtain favorable solubility in an organic solvent.

Z5 represents a divalent linear or branched hydrocarbon group having 1 to 12 carbon atoms.

i' is an integer of 0 to 3, and preferably 0 in view of resolution.

Z' represents a monocyclic or polycyclic atomic group, and Z' and a lactone ring are condensed. That is, Z' represents an atomic group constituting a cyclic hydrocarbon group together with an ester-bonded carbon atom and 2 carbon atoms constituting a lactone ring. This cyclic hydrocarbon group may be a cross-linking cyclic hydrocarbon group. The number of carbon atoms of this cyclic hydrocarbon group is not specifically limited, but preferably 4 to 8. This cyclic hydrocarbon group may have a substituent. Examples of the substituent may include a linear or branched alkyl group having 1 to 6 carbon atoms, a hydroxyl group, a carboxyl group, or a carboxyl group esterified with an alcohol having 1 to 6 carbon atoms. In particular, preferably, the cyclic hydrocarbon group has no substituent to easily obtain favorable solubility in an organic solvent. In a case in which the cyclic hydrocarbon group has a substituent, a methyl group, an ethyl group, or an isopropyl group is preferable to easily obtain favorable solubility in an organic solvent.

In Formula (2), the ester-bonded carbon atom means a carbon atom bonded to an oxygen atom (—O—) of —Z5-C(O)—O— in Formula (2). When i' is 0, this carbon atom is bonded to L' in Formula (2). When i' is 0 and L' is a single bond, this carbon atom is bonded to a (meth)acryloyloxy group.

n represents an integer of 0 to 4. For example, when n is 0, the lactone ring in the constituent unit (2) represented by Formula (2) is a four-membered ring, and when n is 4, it is an eight-membered ring.

As the constituent unit represented by Formula (2), constituent units represented by the following Formulas (2-1) and (2-2) are preferable in view of thermal resistance and etching resistance.

The constituent unit represented by Formula (2-1) or the constituent unit represented by Formula (2-2) is formed by cleavage of an ethylenic double bond of a (meth)acrylic acid ester derivative (monomer) corresponding to each constituent unit.

[chemical formula 12]

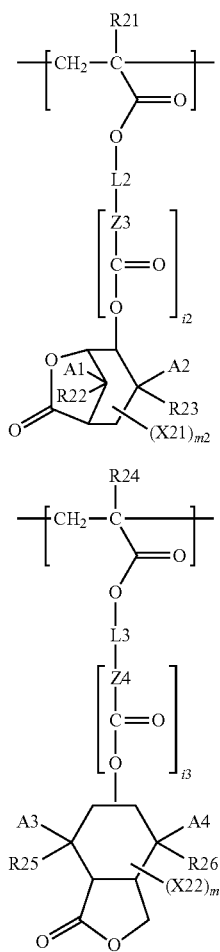

(2-1)

(2-2)

[Constituent unit represented by Formula (2-1)]

In Formula (2-1), R21 represents a hydrogen atom or a methyl group. A methyl group is preferable in view of thermal resistance.

In Formula (2-1), R22 and R23 each independently represent a hydrogen atom, a linear or branched alkyl group having 1 to 6 carbon atoms, a hydroxyl group, a carboxyl group, or a carboxyl group esterified with an alcohol having 1 to 6 carbon atoms. A hydrogen atom, a methyl group, an ethyl group, or an isopropyl group is preferable to easily obtain favorable solubility in an organic solvent. In particular, a hydrogen atom is preferable to easily obtain favorable solubility in an organic solvent.

A1 and A2 together represent —O—, —S—, —NH— or a methylene chain [—(CH$_2$)$_k$— (k represents an integer of 1 to 6)] having 1 to 6 carbon atoms. A methylene chain (methylene group) having 1 carbon atom is preferable in view of dry etching resistance.

X21 represents a linear or branched alkyl group which has 1 to 6 carbon atoms and may have a substituent, a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, or an amino group.

The substituent in X21 is one or more kinds selected from the group consisting of a hydroxyl group, a carboxyl group, an acyl group having 1 to 6 carbon atoms, au alkoxy group having 1 to 6 carbon atoms, a carboxyl group esterified with an alcohol having 1 to 6 carbon atoms, and an amino group.

m2 is an integer of 0 to 4. When m2 is 2 or greater, plurality of X21 present in a single constituent unit may be the same or different from each other. It is preferable that m2 is 0 to easily obtain favorable solubility in an organic solvent.

L2 represents a divalent linear or branched hydrocarbon group which has 1 to 20 carbon atoms and may have a substituent, a divalent cyclic hydrocarbon group which has 1 to 20 carbon atoms and may have a substituent and/or a hetero atom, or a single bond.

Examples of the substituent or the hetero atom in L2 may include the same substituents or hetero atoms as the examples in L1 of Formula (1). L2 is preferably a single bond to easily obtain favorable solubility in an organic solvent.

Z3 represents a divalent linear or branched hydrocarbon group having 1 to 12 carbon atoms.

i2 is an integer of 0 to 3, and preferably 0 in view of resolution.

Preferable examples of the constituent unit represented by Formula (2-1) may include constituent units represented by the following Formulas (6-1) to (6-6). Of these, particularly, the constituent unit represented by Formula (6-1) is preferable since more favorable dry etching resistance can be easily obtained.

[chemical formula 13]

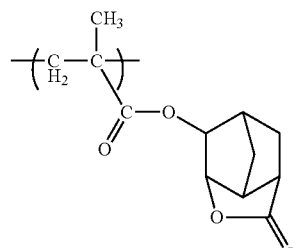

(6-1)

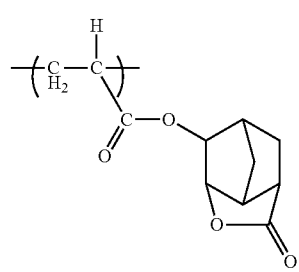

(6-2)

(6-3)
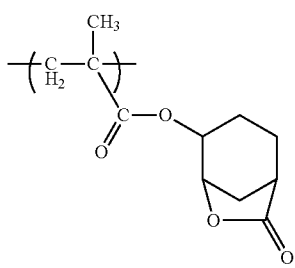

(6-4)
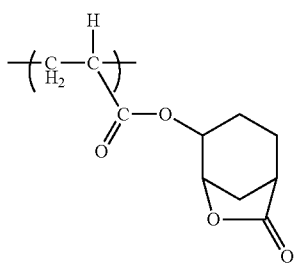

(6-5)
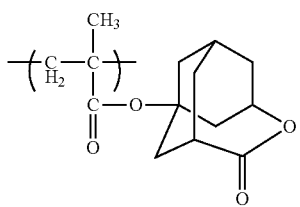

(6-6)
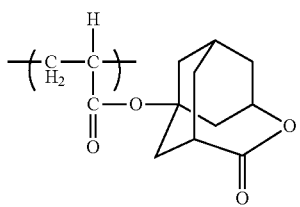

[Constituent Unit Represented by Formula (2-2)]

In Formula (2-2), R24 represents a hydrogen atom or a methyl group. A methyl group is preferable in view of thermal resistance.

In Formula (2-2), R25 and R26 each independently represent a hydrogen atom, a linear or branched alkyl group having 1 to 6 carbon atoms, a hydroxyl group, a carboxyl group, or a carboxyl group esterified with an alcohol having 1 to 6 carbon atoms. A hydrogen atom, a methyl group, an ethyl group, or an isopropyl group is preferable to easily obtain favorable solubility in an organic solvent. In particular, a hydrogen atom is preferable to easily obtain favorable solubility in an organic solvent.

A3 and A4 each independently represent a hydrogen atom, a linear or branched alkyl group having 1 to 6 carbon atoms, a hydroxyl group, a carboxyl group, or a carboxyl group esterified with an alcohol having 1 to 6 carbon atoms, or A3 and A4 together represent —O—, —S—, —NH— or a methylene chain [—(CH$_2$)$_1$— (1 represents an integer of 1 to 6)] having 1 to 6 carbon atoms. A methylene chain (methylene group) having 1 carbon atom is preferable in view of dry etching resistance.

X22 represents a linear or branched alkyl group which has 1 to 6 carbon atoms and may have a substituent, a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, or an amino group.

The substituent in X22 is one or more kinds selected from the group consisting of a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, and an amino group m3 is an integer of 0 to 4. When m3 is 2 or greater, plurality of X22 present in a single constituent unit may be the same or different from each other. It is preferable that m3 is 0 to easily obtain favorable solubility in an organic solvent L3 represents a divalent linear or branched hydrocarbon group which has 1 to 20 carbon atoms and may have a substituent, a divalent cyclic hydrocarbon group which has 1 to 20 carbon atoms and may have a substituent and/or a hetero atom, or a single bond.

Examples of the substituent or the hetero atom in L3 may include the same substituents or hetero atoms as the examples in L1 of Formula (1). L3 is preferably a single bond to easily obtain favorable solubility in an organic solvent.

Z4 represents a divalent linear or branched hydrocarbon group having 1 to 12 carbon atoms.

i3 is an integer of 0 to 3, and preferably 0 in view of resolution.

Preferable examples of the constituent unit represented by Formula (2-2) may include constituent units represented by the following Formulas (7-1) to (7-4). Of these, particularly, the constituent unit represented by Formula (7-1) is preferable since more favorable dry etching resistance can be easily obtained.

[chemical formula 14]

(7-1)
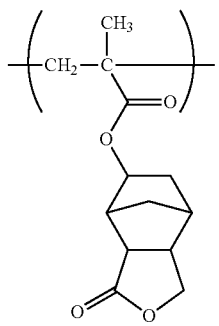

(7-2)
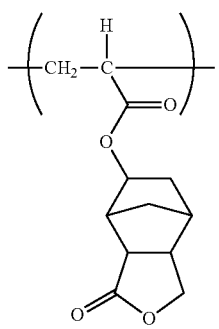

-continued

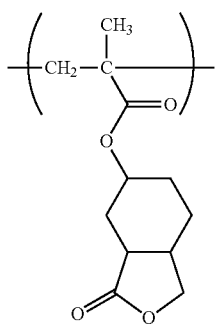
(7-3)

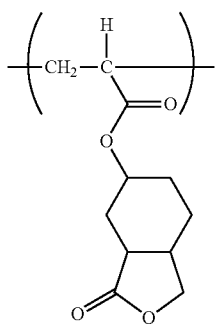
(7-4)

<Constituent Unit (3)>

The constituent unit (3) contains an acid leaving group. The term "acid leaving group" refers to a group having a bond cleaved by an acid, and by cleavage of this bond, an acid leaving group in whole or in part is departed from a main chain of a polymer. In a resist composition, a copolymer having a constituent unit having an acid leaving group reacts with an acid component so as to be soluble in an alkaline solution and thus can form a resist pattern.

The constituent unit (3) is obtained from a monomer having an acid leaving group. The monomer having an acid leaving group is a compound having an acid leaving group and a polymerizable multiple bond and may use any monomer publicly-known. The polymerizable multiple bond is a multiple bond forming a copolymeric chain by cleavage during a polymerization reaction, and preferably, it is an ethylenic double bond.

The constituent unit (3) is formed by cleavage of an ethylenic double bond of a (meth)acrylic acid ester derivative (hereinafter, sometimes referred to as "monomer (3)") containing an acid leaving group.

Specific examples of the monomer (3) may include a (meth)acrylic acid ester that contains an alicyclic hydrocarbon group having 6 to 20 carbon atoms and also contains an acid leaving group. This alicyclic hydrocarbon group may be directly bonded to an oxygen atom constituting an ester bond of the (meth)acrylic acid ester or may be bonded thereto via a linker such as an alkylene group.

The monomer (3) may include a (meth)acrylic acid ester that contains an alicyclic hydrocarbon group having 6 to 20 carbon atoms and also contains a tertiary carbon atom at a binding site with an oxygen atom constituting an ester bond of the (meth)acrylic acid ester, or a (meth)acrylic acid ester that contains an alicyclic hydrocarbon group having 6 to 20 carbon atoms and also contains —COOR group (R represents a tertiary hydrocarbon group, a tetrahydropyranyl group, a tetrahydropyranyl group, or an oxepanyl group which may include a substituent) bonded to the alicyclic hydrocarbon group directly or via a linker.

Preferable examples of the constituent unit (3) may include constituent units represented by the following Formulas (8-1) to (8-10). In the following Formulas (8-1) to (8-10), R represents a hydrogen atom or a methyl group.

Of these, particularly, the constituent units represented by Formulas (8-1) to (8-4) are preferable since more favorable dry etching resistance can be easily obtained.

[chemical formula 15]

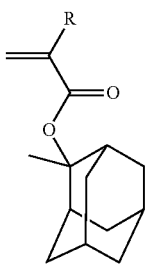
(8-1)

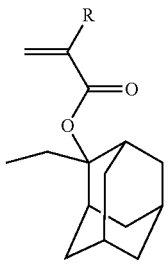
(8-2)

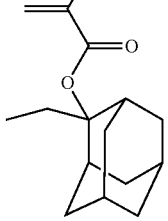
(8-3)

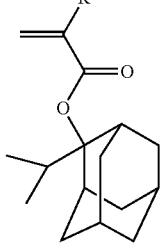
(8-4)

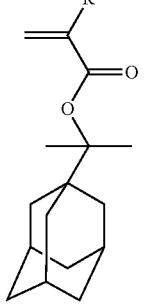
(8-5)

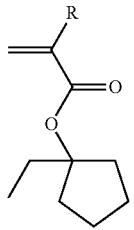
(8-6)

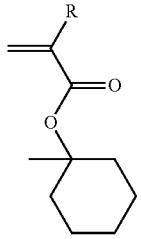
(8-7)

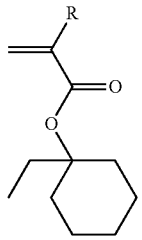
(8-8)

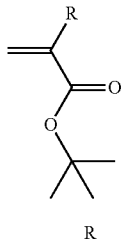
(8-9)

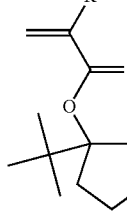
(8-10)

<Resist Copolymer>

The copolymer of the invention may include one or more kinds of other constituent units as necessary besides the repeating constituent units (1) to (3). As the other constituent unit, a publicly-known constituent unit for a resist copolymer can be used. The other constituent unit is a (meth)acrylic acid ester derivative and preferably, it is formed by cleavage of an ethylenic double bond of a monomer.

As the other constituent unit, there may be a constituent unit that has a group which is a polar group and hydrophilic group but is not included in the constituent unit (1). Further, there may be a constituent unit that has a group which has a polar group but is not included in the constituent unit (2).

In the present specification, the polar group may include a cyano group, a group containing a lactone backbone, a hydroxyl group, an alkoxy group, a carboxyl group, an amino group, a carbonyl group, a group containing a fluorine atom, a group containing a sulfur atom, a group containing an acetal structure, or a group containing an ether bond.

In the present specification, of these, a group which is a polar group and hydrophilic group is a cyano group, $-C(CF_3)_2-OH$, a hydroxyl group, a methoxy group, a carboxyl group, or an amino group.

With respect to the whole constituent units of the copolymer of the present invention, a content of a constituent unit having a group that is a polar group and hydrophilic group is preferably 5 to 30 mol % and more preferably 10 to 25 mol % in view of rectangular property of a resist pattern. Further, with respect to the total amount of the constituent unit having a group that is a polar group and hydrophilic group present in the copolymer of the present invention, a proportion of the constituent unit (1) is preferably 50 mol % or more, more preferably 80 mol % or more, and particularly preferably 100 mol %.

With respect to the whole constituent units of the copolymer of the invention, a content of a constituent unit that has a polar group (excluding a hydrophilic group) is preferably 20 mol % or more, and more preferably 25 mol % or more in view of adhesion to a substrate or the like. Meanwhile, the content is preferably 60 mol % or less, more preferably 55 mol % or less, and still more preferably 50 mol % or less in view of sensitivity and resolution. Further, with respect to the total amount of the constituent unit that has a polar group (excluding a hydrophilic group) present in the copolymer of the present invention, a proportion of the constituent unit (2) is preferably 50 mol % or more, more preferably 80 mol % or more, and particularly preferably 100 mol %.

With respect to the whole constituent units of the copolymer of the present invention, a content of the constituent unit (3) that has an acid leaving group is preferably 20 mol % or more, and more preferably 25 mol % or more in view of sensitivity and resolution. Meanwhile, the content is preferably 60 mol % or less, more preferably 55 mol % or less, and still more preferably 50 mol % or less in view of adhesion to a substrate or the like.

Further, with respect to the whole constituent units of the copolymer of the present invention, a content of the constituent units (1) to (3) is preferably 50 mol % or more, more preferably 80 mol % or more, and particularly preferably 100 mol %.

<Manufacturing Method of Resist Copolymer>

The copolymer of the present invention is obtained by polymerizing a monomer composition containing the monomers (1), (2), and (3) using a polymerization initiator in the presence of a polymerization solvent. Polymerization may be carried out according to a radical polymerization method, or adequately using a publicly-known method such as a bulk polymerization method, a solution polymerization method, a suspension polymerization method, and an emulsion polymerization method. Of these, a solution polymerization method is preferable, and a feeding polymerization method is more preferable.

Preferably, the polymerization initiator efficiently generates radicals by heat. Examples of the polymerization initiator may include a azo compound (2,2'-azobisisobutyronitrile, dimethyl-2,2'-azobisisobutylate, 2,2'-azobis[2-(2-imidazoline-2-yl)propane], and the like), an organic peroxide (2,5-dimethyl-2,5-bis(tert-butylperoxy)hexane, di(4-tert-butylcyclohexyl)peroxydicarbonate, and the like), and the like.

An adequate temperature for using these polymerization initiators is in a range of 50 to 150° C.

The polymerization solvent may include, for example, the following solvents.

Ethers: chain ether (diethyl ether, propylene glycol monomethyl ether, and the like), cyclic ether (tetrahydrofuran (sometimes described as "THF"), 1,4-dioxane, and the like), and the like.

Esters: methyl acetate, ethyl acetate, butyl acetate, ethyl lactate, butyl lactate, propylene glycol monomethyl ether acetate (sometimes described as "PGMEA"), and γ-butyrolactone (sometimes described as "γ-BL"), and the like.

Ketones: acetone, methyl ethyl ketone (sometimes described as "MEK"), methyl isobutyl ketone (sometimes described as "MIBK"), cyclohexanone, and the like.

Amides: N,N-dimethylacetamide, N,N-dimethylformamide, and the like.

Sulfoxides: dimethylsulfoxide, and the like.

Aromatic hydrocarbon: benzene, toluene, xylene, and the like.

Aliphatic hydrocarbon: hexane, and the like.

Alicyclic hydrocarbon: cyclohexane, and the like.

The polymerization solvents may be used alone or in combination of two or more of them.

<Resist Composition>

The resist composition of the present invention is obtained by mixing the copolymer of the invention with a publicly-known resist solvent and other components suitable for use.

The copolymer of the invention is suitable for a resist copolymer, and a chemically amplified resist composition can be prepared by mixing a compound (photoacid generator) that generates acid by irradiation with actinic light or radioactive ray, a resist solvent, and a certain component to be blended as necessary.

In the invention, a content proportion of the respective constituent units in the copolymer are regarded as the same as a proportion of the respective monomers when the monomers corresponding to the respective constituent units are copolymerized to prepare the copolymer.

[Resist Composition]

As the resist solvent, the solvents described above as the polymerization solvents may be used.

The photoacid generator can be arbitrarily selected from those which can be used as a photoacid generator of a chemically amplified resist composition. The photoacid generators may be used alone or in combination of two or more of them. Examples of the photoacid generator may include an onium salt compound, a sulfone imide compound, a sulfone compound, a sulfonic acid ester compound, a quinonediazide compound, a diazomethane compound, and the like. An amount of the photoacid generator used is preferably 0.1 to 20 parts by mass and more preferably 0.5 to 10 parts by mass with respect to 100 parts by mass of the polymer.

The chemically amplified resist composition may contain a nitrogen-containing compound, or may contain an acidic compound such as an organic carboxylic acid, or an oxo acid of phosphorus or its derivatives. Further, it may contain various additives such as a surfactant, other quenchers, a sensitizer, a halation inhibitor, a storage stabilizer, an antifoaming agent, and the like as necessary. Additives publicly known may be adequately used in the resist composition.

EXAMPLE

Hereinafter, the invention will be explained in detail with reference to Examples, but the invention is not limited thereto. Further, in each Example and Comparative Example, the term "parts" denotes "parts by mass" unless specifically limited. The symbol "%" indicative of a concentration denotes "mass percent" unless specifically limited. A measurement method and an evaluation method were as follows.

A weight average molecular weight (Mw) and a molecular weight distribution (Mw/Mn (Mn is a number average molecular weight)) of a polymer were obtained by polystyrene conversion by gel permeation chromatography under the following conditions (GPC conditions).

[GPC Conditions]

Apparatus: TOSOH high-speed GPC apparatus HLC-8220GPC (trade name), manufactured by TOSOH CORPORATION, Separation column: column prepared by connecting three columns (Shodex GPC K-805L (trade name) manufactured by Showa Denko K.K.) in series, Measurement temperature: 40° C., Eluent: tetrahydrofuran (THF), Sample: solution obtained by dissolving about 20 mg of a polymer in 5 mL of THF and filtering a mixed solution through a 0.5 μm membrane filter, Flow rate: 1 mL/min, Injected amount: 0.1 mL, Detector: differential reflectometer.

Calibration curve 1: about 20 mg of standard polystyrene was dissolved in 5 mL of THF. Then, the mixed solution was filtered through a 0.5 μm membrane filter to obtain a solution, which was then injected into a separation column under the above-described conditions. Then, a relationship between elution time and molecular weight was obtained. The following standard polystyrenes (all products are represented by trade names) produced by TOSOH CORPORATION were used as the standard polystyrenes.

F-80 (Mw=706,000),
F-20 (Mw=190,000),
F-4 (Mw=37,900),
F-1 (Mw=10,200),
A-2500 (Mw=2,630),
A-500 (mixture of polystyrenes having Mw=682, 578, 474, 370, and 260).

<Etching Resistance Evaluation Method>

In the present method, there was used a copolymer solution obtained by dissolving a resist copolymer in a solvent and filtering a mixed solution through a membrane filter having a hole diameter of 0.1 μm.

A 2 inch silicon wafer was used as a substrate to be processed, and the copolymer solution was applied to a surface of the silicon wafer by spin coating and baked on a hot plate at 120° C. for 60 seconds to thereby form a thin film having a thickness of 300 nm, which was a test piece.

Evaluation of etching resistance was carried out by a typical reactive ion-etching method using inductively coupled plasma. That is, a chlorine gas was introduced into a vacuum chamber and a vacuum level was set to 75 mTorr (10 Pa). 800 W of a high frequency electric field of 13.6 MHz was applied to an antenna for plasma generation, and the test piece was installed at a position 10 cm away from a plasma generation position and etched until a film thickness of the thin film on the substrate was decreased by 35 nm. A temperature of the substrate was controlled to room temperature (25° C.). An etching time from when the etching process was started to when the film thickness was decreased by 35 nm was measured, and a variation in film thickness per 1 minute of the etching time was measured so as to obtain an etching rate.

According to the present method, it is possible to evaluate etching resistance in a resist pattern (non-exposed portion) formed using a positive resist composition containing a resist copolymer to be evaluated.

To be specific, as an etching rate decreases, etching resistance increases. That is, when a variation in film thickness before and after etching is the same, as an etching time increases, etching resistance increases.

<Measurement of Surface Roughness>

The surface roughness of the test piece alter etching was measured by a surface profile measurement method with a scanning probe microscope (SPM). As an SPM apparatus, an S-image (trade name) manufactured by SH NanoTechnology Inc. was used, and as a cantilever, a SI-DF20 (trade name) manufactured by SH NanoTechnology Inc. was used. In the DFM mode, a surface profile measurement was carried out to the etched portion of the test piece. A measurement range was 400 nm×400 nm per 1 view (1 site), and a measurement was carried out to 4 views (4 sites) for each test piece. With respect to each measurement view, the root mean square roughness (Rq) was calculated according to JIS-130601, and an average Rq of 4 sites in each test piece was calculated as the surface roughness.

<Resist Composition Sensitivity Evaluation Method>

In the present method, there was used a chemically amplified resist composition obtained by uniformly mixing a resist copolymer, a photoacid generator, and a solvent and filtering a mixed solution through a membrane filter having a hole diameter of 0.1 μm.

First, the chemically amplified resist composition was applied to a 6 inch silicon wafer by spin coating and pre-baked (PA) on a hot plate at 120° C. for 60 seconds to thereby form a resist film having a thickness of 300 nm.

With an ArF excimer laser exposure device (trade name: VUVES-4500 manufactured by Litho Tech Japan Corporation), 18 shots having different exposure doses were exposed to an area of 10 mm×10 mm per shot. Then, after post-baking (PEB) at 110° C. for 60 seconds, development was carried out with 2.38% b) mass of a tetramethyl ammonium hydroxide aqueous solution by a resist development analyzer (trade name: RDA-806 manufactured by Litho Tech Japan Corporation) at 23° C. for 65 seconds. Then, a change in a resist film thickness with time during development was measured at each exposure dose.

Based on the data obtained as such, the relationship between the logarithm of the exposure dose (mJ/cm$^2$) and the proportion (unit: %, hereinafter, referred to as "residual film ratio") of a residual film thickness when the resist film was developed for 60 seconds with respect to the initial film thickness was plotted on a curve (hereinafter referred to as "exposure dose-residual film ratio curve"). Eth sensitivity (exposure dose required to reduce the residual film ratio to 0%; representing sensitivity) was obtained as follows.

Eth sensitivity: exposure dose (mJ/cm$^2$) at a point where the exposure dose-residual film ratio curve crosses a residual film ratio of 0%.

As a value of the Eth sensitivity decreases, sensitivity increases.

Synthesis Example 1

Preparation of Intermediate 3-cyano-1-adamantanol of an intermediate of a monomer expressed by represented by the following Formula (m6) and 3,5-dicyano-1-adamantanol of an intermediate of a monomer represented by the following Formula (m5) were synthesized.

10.9 g (0.08 mol) of 1-adamantanol, 29.0 g (0.16 mol) of p-toluenesulfonyl cyanide, and 29.1 g (0.16 mol) of benzophenone were put into a reactor for a high pressure mercury lamp and then dried under depressurization. This reactor was placed into a nitrogen-purged globe compartment and the dried product was dissolved in 1 L of anhydrous acetonitrile. Alter deaeration by a freeze-thawing method, the high pressure mercury lamp was set. The solution was cooled in a water bath at 20° C. and irradiated with ultraviolet ray for 6 hours under stirring with a magnetic stirrer. After reaction, the acetonitrile was removed under depressurization, and then, separation was carried out by a silica gel column, thereby obtaining fractions containing 3-cyano-1-adamantanol and 3,5-dicyano-1-adamantanol, respectively.

The above operation was repeated 12 times, and then, fractions of respective compounds were collected, and condensed by an evaporator, thereby obtaining fractions containing 12.2 g of 3-cyano-1-adamantanol and 36.5 g of 3,5-dicyano-1-adamantanol, respectively.

Synthesis Example 2

Preparation of Monomer Represented by Formula (m6)

12.0 g (0.07 mol) of 3-cyano-1-adamantanol obtained in Synthesis Example 1. 0.4 g (0.01 mol) of magnesium oxide, 30 mg of dibutyl hydroxytoluene, and 100 g of toluene were put into a 500 ml branched flask connected with a reflux condenser, an impeller, a temperature gauge, and an air injection pipe, and suspended by stirring and air bubbling. During suspending, a temperature was increased to 80° C., and 18.5 g (0.12 mol) of methacrylic anhydride was added dropwise for 30 minutes. After feeding, a reaction was carried out at a temperature of 80° C. for 8 hours, and then, a suspension was cooled to room temperature.

While the suspension was cooled, 100 g of a 10% sodium hydroxide aqueous solution was added thereto and suspended at room temperature for 1 hour. This solution was filtered, and a filtrate was put into a 1 L separatory lot so as to be separated into two layers, and then, an aqueous phase was removed. An operation of washing a toluene phase by adding 300 g of water was carried out 4 times. A filtrated residue after filtering was washed with 30 ml of water 3 times and then mixed with the toluene phase.

2 mg of p-methoxyhydroquinone was added to the toluene phase, and the solvent was removed by the evaporator, thereby obtaining 14.6 g (0.06 mol) of a monomer represented by the following Formula (m6).

Synthesis Example 3

Preparation of Monomer Represented by Formula (m5)

36.0 g (0.18 mol) of 3,5-dicyano-1-adamantanol obtained in Synthesis Example 1, 2.4 g (0.06 mol) of magnesium oxide, 80 mg of dibutyl hydroxytoluene, and 300 g of toluene were put into an 1 L branched flask connected with a reflux condenser, an impeller, a temperature gauge, and an air injection pipe, and suspended by stirring and air bubbling. During suspending, a temperature was increased to 80° C., and 95.6 g (0.62 mol) of methacrylic anhydride was added dropwise for 30 minutes. After feeding, a reaction was carried out at a temperature of 80° C. for 8 hours, and then, a suspension was cooled to room temperature.

While the suspension was cooled, 600 g of a 10% sodium hydroxide aqueous solution was added thereto and suspended at room temperature for 1 hour. This solution was filtered, and a filtrate was put into a 2 L separatory lot so as to be separated into two layers, and then, an aqueous phase was removed. An operation of washing a toluene phase by adding 900 g of water was carried out 4 times. A filtrated residue after filtering was washed with 100 ml of water 3 times and then mixed with the toluene phase.

6 mg of p-methoxyhydroquinone was added to the toluene phase, and the solvent was removed by the evaporator, thereby obtaining 39.5 g (0.15 mol) of a monomer represented by the following Formula (m5).

Example 1

43.2 parts of propylene glycol monomethyl ether acetate (PGMEA) and 18.5 parts of γ-butyrolactone (γ-BL) were put into a flask equipped with a nitrogen introduction port, a stirrer, a condenser, a dropping funnel, and a temperature gauge in a nitrogen atmosphere. The flask was bathed. Then, the bath temperature was raised to 80° C. while stirring the content in the flask.

Then, the following mixture 1 was added dropwise to the flask through the dropping funnel over 4 hours. Then, the flask was kept at 80° C. for 3 hours, thereby obtaining a reaction solution.
(Mixture 1)

A mixture of 35.9 parts of a monomer represented by the following Formula (m1) as the monomer (2) having a lactone backbone, 35.6 parts of a monomer represented by the following Formula (m4) as the monomer (3) containing an acid leaving group, 20.5 parts of a monomer represented by the following Formula (m5) as the monomer (1) having multiple cyano groups, 55.9 parts of PGMEA and 37.2 parts of γ-BL as a solvent, and 6.1 parts of dimethyl-2,2'-azobisisobutylate (V601 (trade name), produced by Wako Pure Chemical Industries, Ltd.) as a polymerization initiator. Input proportions (mol %) of the respective monomers are shown in Table 1 (hereinafter the same).

[chemical formula 16]

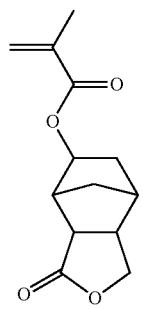

(m1)

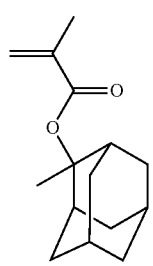

(m4)

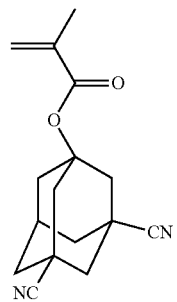

(m5)

The obtained reaction solution was added dropwise under stirring to a mixed solvent of methanol and water (volume ratio of methanol/water=90/10) in an amount about 10 times as much, and a white precipitate (polymer A) was obtained. The precipitate was separated by filtering and then, put again into a mixed solvent of methanol and water (volume ratio of methanol/water=95/5) in the same amount as described above, and the precipitate was washed under stirring. Then, the washed precipitate was separated by filtering, and polymer wet powder was obtained. Then, the polymer wet powder was dried at 40° C. for about 40 hours under depressurization, thereby obtaining a polymer A in the form of dry powder.

A weight average molecular weight (Mw) and a molecular weight distribution (Mw/Mn) of the obtained polymer are shown in Table 1 (hereinafter the same).
(Evaluation)

2.0 parts of the obtained polymer A was mixed with 14.4 parts of PGMEA and 3.6 parts of γ-BL of a solvent so as to form a homogeneous solution. Then, the solution was filtered through a membrane filter having a hole diameter of 0.1 μm, thereby preparing a copolymer solution. With the obtained copolymer solution, etching resistance and surface roughness were evaluated according to the above-described method. According to the following criteria, an evaluation result is shown in Table 2 (hereinafter the same).

Etching resistance (Etching rate)
A: 4 nm/min or less.
B: more than 4 nm/min to 5 nm/min or less.
C: more than 5 nm/min.
Surface roughness (root mean square roughness)
A: 1 nm or less.
B: more than 1 nm to 2 nm or less.
C: more than 2 nm.

Further, 100 parts of the obtained polymer A was mixed with 2 parts of triphenylsulfonium triflate of a photoacid generator, and 720 parts of PGMEA and 180 parts of ethyl lactate as a solvent, so as to form a homogeneous solution. Then, the solution was filtered through a membrane filter having a hole diameter of 0.1 μm, thereby preparing a chemically amplified resist composition. With the obtained chemically amplified resist composition, the sensitivity of the resist composition was evaluated according to the above-described method. An evaluation result is shown in Table 2 (hereinafter the same).

Example 2

A polymer B in the form of dry powder was obtained in the same manner as Example 1 except that an amount of PGMEA and an amount of γ-BL used in Example 1 were changed to 42.6 parts and 18.2 parts, respectively, and the mixture 1 added dropwise was changed to the following mixture 2. Then, evaluation was carried out.
(Mixture 2)

A mixture of 33.7 parts of a monomer represented by the following Formula (m2) as the monomer (2) having a lactone backbone, 35.6 parts of a monomer represented by the following Formula (m4) as the monomer (3) containing an acid leaving group, 20.5 parts of a monomer represented by the following Formula (m5) as the monomer (1) having multiple cyano groups, 55.6 parts of PGMEA and 37.0 parts of γ-BL of a solvent, and 6.1 parts of the V601 (trade name) of a polymerization initiator

[chemical formula 17]

(m2)

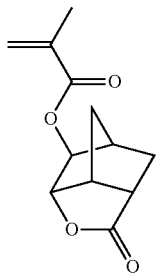

(m4)

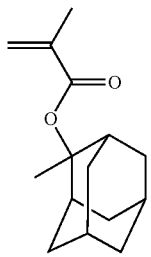

(m5)

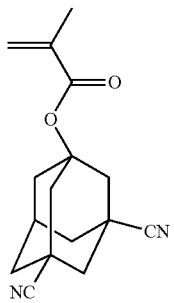

Comparative Example 1

A polymer C in the form of dry powder was obtained in the same manner as Example 1 except that an amount of PGMEA and an amount of γ-BL used in Example 1 were changed to 40.3 parts and 17.2 parts, respectively, and the mixture 1 added dropwise was changed to the following mixture 3. Then, evaluation was carried out.

(Mixture 3)

A mixture of 25.8 parts of a monomer represented by the following Formula (m3) as a comparative monomer having a lactone backbone but not included in the constituent unit (2), 35.6 parts of a monomer represented by the following Formula (m4) as the monomer (3) containing an acid leaving group, 20.5 parts of a monomer represented by the following Formula (m5) as the monomer (1) having multiple cyano groups, 54.4 parts of PGMEA and 36.2 parts of γ-BL as a solvent, and 6.5 parts of the V601 (trade name) as a polymerization initiator.

[chemical formula 18]

(m3)

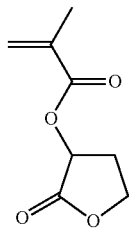

(m4)

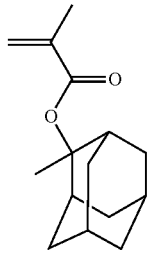

(m5)

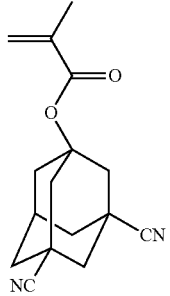

Comparative Example 2

A polymer D in the form of dry powder was obtained in the same manner as Example 1 except that an amount of PGMEA and an amount of γ-BL used in Example 1 were changed to 42.1 parts and 18.0 parts, respectively, and the mixture 1 added dropwise was changed to the following mixture 4. Then, evaluation was carried out.

(Mixture 4)

A mixture of 35.9 parts of a monomer represented by the following Formula (m1) as the monomer (2) having a lactone backbone, 35.6 parts of a monomer represented by the following Formula (m4) as the monomer (3) containing an acid leaving group, 18.6 parts of a monomer represented by the following Formula (m6) as a comparative monomer having a single cyano group, 54.2 parts of PGMEA and 36.1 parts of γ-BL as a solvent, and 6.1 parts of the V601 (trade name) as a polymerization initiator.

[chemical formula 19]

(m1)

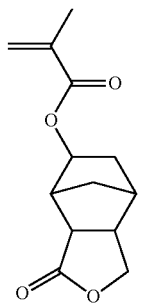

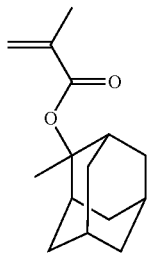 (m4)

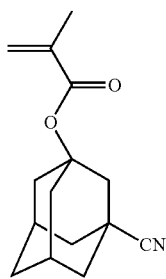 (m6)

Comparative Example 3

A polymer E in the form of dry powder was obtained in the same manner as Example 1 except that an amount of PGMEA and an amount of γ-BL used in Example 1 were changed to 41.7 parts and 17.8 parts, respectively, and the mixture 1 added dropwise was changed to the following mixture 5. Then, evaluation was carried out.

(Mixture 5)

A mixture of 35.9 parts of a monomer represented by the following Formula (m1) as the monomer (2) having a lactone backbone, 35.6 parts of a monomer represented by the following Formula (m4) as the monomer (3) containing an acid leaving group, 17.9 parts of a monomer represented by the following Formula (m7) as a comparative monomer having a single hydroxyl group instead of cyano groups, 53.5 parts of PGMEA and 35.7 parts of γ-BL as a solvent, and 5.7 parts of the V601 (trade name) as a polymerization initiator.

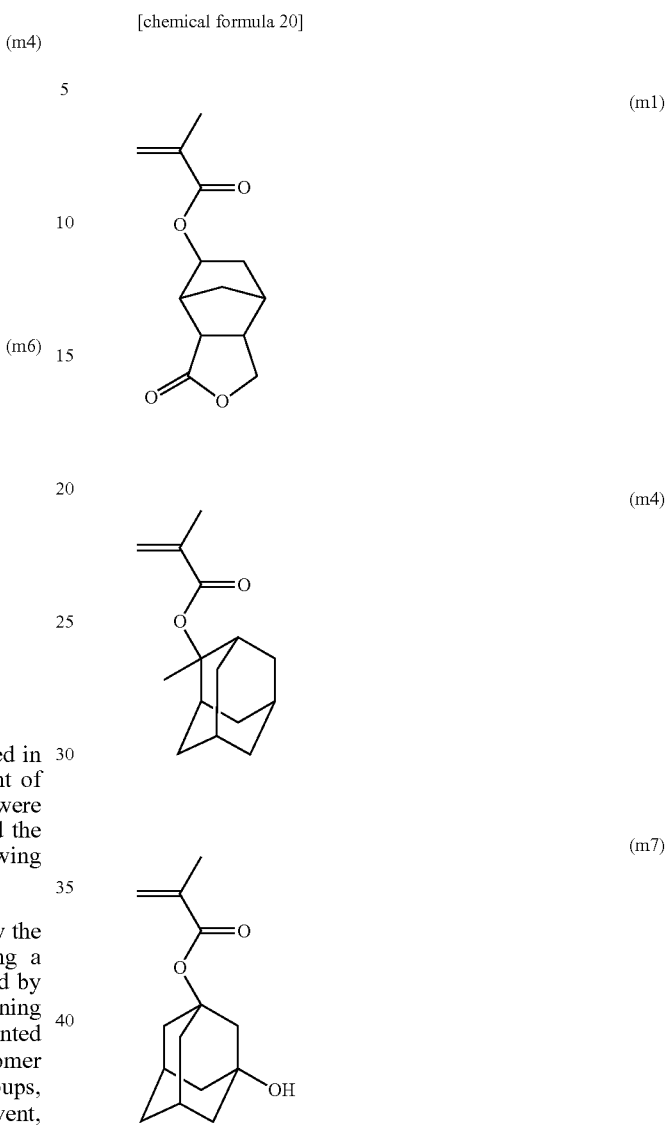

[chemical formula 20]

TABLE 1

| | | Monomer input proportion (mol %) | | | | | | | |
|---|---|---|---|---|---|---|---|---|---|
| | | Monomer (2) | | Comparative monomer | Monomer (3) | Monomer (1) | Comparative monomer | | |
| | Polymer | m1 | m2 | m3 | m4 | m5 | m6 | m7 | Mw | Mw/Nn |
| Example 1 | A | 40 | | | 40 | 20 | | | 10200 | 1.74 |
| Example 2 | B | | 40 | | 40 | 20 | | | 10600 | 1.74 |
| Comparative Example 1 | C | | | 40 | 40 | 20 | | | 10800 | 1.77 |
| Comparative Example 2 | D | 40 | | | 40 | | 20 | | 9400 | 1.76 |
| Comparative Example 3 | E | 40 | | | 40 | | | 20 | 11700 | 1.79 |

TABLE 2

| | Sensitivity evaluation | Etching evaluation | |
|---|---|---|---|
| | Eth (mJ/cm$^2$) | Etching resistance | Surface roughness |
| Example 1 | 1.9 | a | a |
| Example 2 | 1.8 | a | a |
| Comparative Example 1 | 1.6 | c | a |
| Comparative Example 2 | 3.5 | b | b |
| Comparative Example 3 | 7.1 | b | c |

From the results as shown in Table 2, the polymers A and B of Example 1 and Example 2 were favorable in terms of sensitivity representing lithography performance of a resist composition, and etching resistance and surface roughness representing etching performance of a resist film.

On the other hand, the polymer C of Comparative Example 1 using another lactone which is not represented by Formula (2) of the present invention as a lactone constituent unit was favorable in terms of sensitivity but deteriorated in terms of etching resistance when formed into a resist composition.

Further, the polymer D of Comparative Example 2 using another monomer which is not represented by Formula (1) of the present invention as a constituent unit having a hydrophilic group, and the polymer E of Comparative Example 3 were deteriorated in all terms of sensitivity, etching resistance, and surface roughness when formed into a resist composition.

The invention claimed is:

1. A copolymer, consisting of:
a constituent unit of formula (4-1):

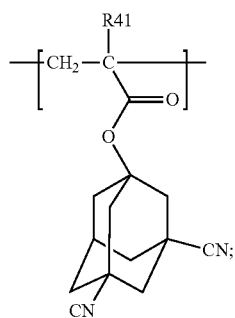
(4-1)

at last one selected from the group consisting of a constituent unit (m1) and a constituent unit (m2):

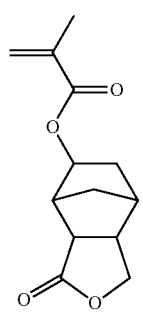
(m1)

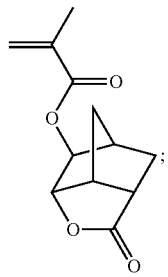
(m2)

and a constituent unit selected from the group consisting of constituent units (8-1) to (8-10 below:

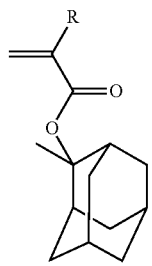
(8-1)

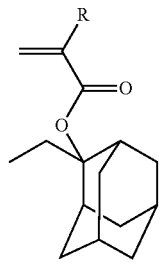
(8-2)

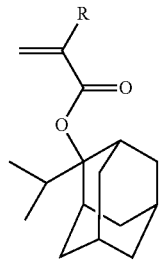
(8-3)

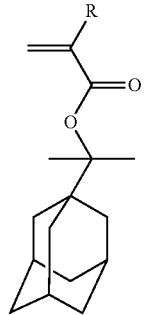
(8-4)

(8-5) 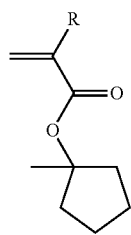
(8-6) 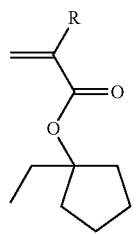
(8-7) 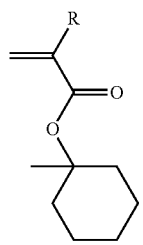
(8-8) 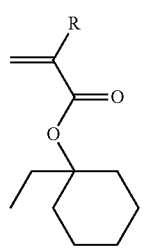
(8-9) 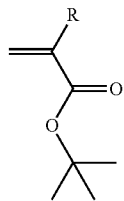
(8-10) 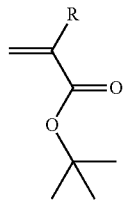
(8-11) 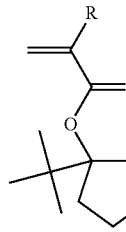
wherein:
R41 is a hydrogen atom or a methyl group; and
R represents a hydrogen atom or a methyl group.
* * * * *